United States Patent [19]

Munier et al.

[11] Patent Number: 4,829,355

[45] Date of Patent: May 9, 1989

[54] PHOTOCATHODE HAVING INTERNAL AMPLIFICATION

[75] Inventors: Bernard Munier, Seyssinet Pariset; Paul de Groot, Grenoble; Claude Weisbuch, Paris; Guy Moiroud, Grenoble; Yves Henry, Eybens, all of France

[73] Assignee: Thomson-CSF, Paris, France

[21] Appl. No.: 942,840

[22] Filed: Dec. 17, 1986

[30] Foreign Application Priority Data

Dec. 20, 1985 [FR] France ................................ 85 18983

[51] Int. Cl.[4] ............................................ H01L 27/14

[52] U.S. Cl. ........................................ 357/30; 357/16; 357/4; 357/58

[58] Field of Search ............. 357/90, 30 B(U.S. only), 357/30 E(U.S. only), 30 F(U.S. only), 30 L(U.S. only), 16, 31, 4, 58

[56] References Cited

U.S. PATENT DOCUMENTS

| | | | |
|---|---|---|---|
| 3,631,303 | 12/1971 | Antypas | 317/234 R |
| 4,088,515 | 5/1978 | Blakeslee et al. | 357/60 X |
| 4,286,275 | 8/1981 | Heiblum | 357/12 |
| 4,383,269 | 5/1983 | Capasso | 357/30 E |
| 4,390,889 | 6/1983 | Capasso et al. | 357/30 E |
| 4,597,004 | 6/1986 | Longeway et al. | 357/30 F |
| 4,599,632 | 7/1986 | Bethea et al. | 357/30 E |

FOREIGN PATENT DOCUMENTS

| | | | |
|---|---|---|---|
| 2235496 | 1/1975 | France . | |
| 60-785 | 1/1985 | Japan | 357/4 X |
| 1023257 | 3/1966 | United Kingdom . | |
| 2030359 | 4/1980 | United Kingdom | 357/30 E |
| 2107927 | 5/1983 | United Kingdom | 357/4 X |

OTHER PUBLICATIONS

"Photoelectric Imaging in the 0.9-1.6 Micron Range", J. S. Escher, P. E. Gregory, S. B. Hyder, R. R. Saxena and R. L. Bell, vol. EDL-2, No. 5, May 1981.

Summers et al., "Variably Spaces Superlattice Energy Filter, a New Device Design Concept for High Energy Electron Injection", *Appl. Phys. Lett*, 48(12), 24 Mar. 1986, pp. 806–808.

Chin et al., "Impact Ionization in Multilayered Heterojunction Structure", *Electronics Letters*, 5 Jun. 1980, vol. 16, No. 12, pp. 467–469.

Capasso et al., "The Superlattice Photodetectors a New Avalanche Protodiode with a Large Ionization Rates Ratio", Conference: Int'l. Electron Devices Meeting, IEEE, (Dec. 7–9, 1981), D.C., 284–287.

Fischer et al., IEEE-EDL 2, 123–125 (1981).

*Primary Examiner*—Andrew J. James
*Assistant Examiner*—William A. Mintel
*Attorney, Agent, or Firm*—Cushman, Darby & Cushman

[57] ABSTRACT

A photocathode having internal amplification includes a first electrode adapted for receiving a first voltage, and for transmitting received photons. An absorption layer is disposed adjacent the first electrode and comprises a P-type semiconductor material having a forbidden band of sufficiently small width to cause photons received through said first electrode to be converted into electron-hole pairs. At least one ionization-induced electron multiplication layer is disposed adjacent the absorption layer. Each such multiplication layer comprises two layers of N-type semiconductor material having respectively two different compositions at an interface therebetween. The two different compositions at the interface cause the multiplication layer, when biased, to accelerate the electrons received from the absorption layer to a degree greater than the acceleration provided to the holes received from the absorption layer. A second electrode is disposed adjacent the multiplication layer and receives a second voltage to cause the photocathode to be biased. In addition, the second electrode transmits the accelerated electrons received from the multiplication layer. An emission layer is disposed adjacent the second electrode and comprises a material which produces negative electron affinity to cause the accelerated electrons received from the second electrode to be emitted into a vacuum.

10 Claims, 4 Drawing Sheets

PHOTOCATHODE HAVING INTERNAL AMPLIFICATION

BACKGROUND OF THE INVENTION

This invention relates to a photocathode for pickup tubes and for image intensifier tubes.

It is a known practice to construct a photocathode having the following main components:

a so-called window layer consisting of P+ type semiconductor material in which the forbidden band is of sufficient width to ensure that said layer is transparent to the wavelengths of the light to be detected and which is bonded to a glass wall for receiving the light to be detected;

a so-called absorption layer consisting of P+ type semiconductor material in which the forbidden band is of sufficiently small width to convert the photons of the light to be detected into electron-hole pairs;

a so-called emission layer consisting of material which produces negative electron affinity at the end of the absorption layer in order to emit into the vacuum the electrons which are liberated within the absorption layer.

The maximum detectable wavelength is limited by the width of the forbidden band of the material which constitutes the absorption layer. By applying a positive bias to that end of said layer which is opposite to the window layer, it is possible to employ materials which have a small forbidden bandwidth while maintaining good emission efficiency and it is therefore possible to detect light having longer wavelengths.

A bias can be applied to the absorption layer by means of a connection with said layer or by a very thin metallic electrode interposed between said layer and the emission layer. A photocathode of this type is described in the article "Photoelectric Imaging in the 0.9–1.6 Micron Range" by J. J. Escher et al., IEEE-EDL2, 123–125 (1981).

In order to construct a pickup tube for use at very low light levels and especially in order to construct an image-intensifier tube, a known practice consists in placing a microchannel plate downstream of the photocathode. The microchannels are supplied by a high-voltage generator and permit multiplication of the electrons emitted from the photocathode into the vacuum. A microchannel plate produces electron multiplication with a high degree of efficiency but imposes many technological constraints including in particular the use of a high-voltage generator. The aim of the invention is to produce an internal-amplification photocathode which permits the use of a microchannel plate having a lower gain, thus reducing the need for technological constraints and even dispensing with the need for a microchannel plate. The object of the invention is a photocathode provided with an absorption layer having a particular structure which produces multiplication of electrons while avoiding any appreciable multiplication of the hole current since this latter gives rise to a dark current which constitutes noise.

SUMMARY OF THE INVENTION

In accordance with the invention, a photocathode having internal amplification and comprising a so-called absorption layer consisting of P+ type semi-conductor material having a forbidden band of sufficiently small width to convert the photons of the light to be detected into electron-hole pairs essentially comprises in addition at least one ionization-induced electron multiplication layer formed of $N^-$ type semiconductor material having a non-uniform composition such that, when said multiplication layer is biased, the electrons are accelerated in the direction in which they are to be emitted and the holes are less accelerated than the electrons, means being provided for biasing the multiplication layer.

DESCRIPTION OF THE PREFERRED EMBODIMENTS

Figure 1A:
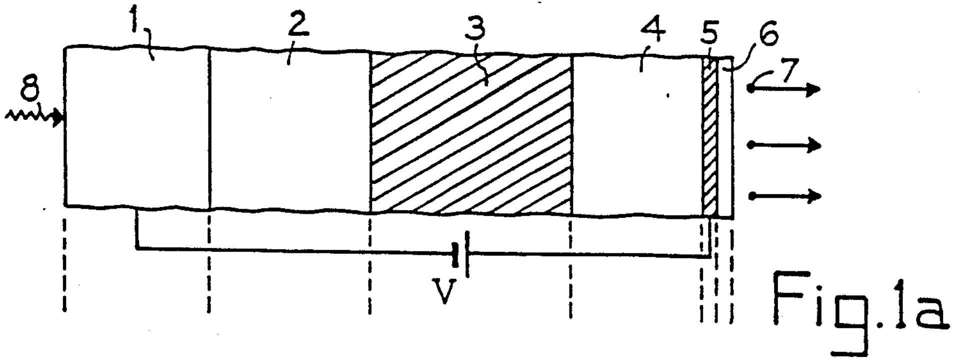
FIGS. 1*a* to 1*c*, 2*a* to 2*c*, 3*a* to 3*c*, and 4*a* to 4*c* each represent one example of construction of the photocathode in accordance with the invention and two diagrams of the energy levels E of the charge carriers within these examples of construction, in one case without biasing and in the other case with biasing.

FIG. 1*a* is a sectional view showing a portion of a first example of construction of the photocathode in accordance with the invention. This first example comprises: a first layer 1 which is transparent to all wavelengths of the light to be detected, which is formed of P+ type semiconductor material bonded to a glass wall (not shown), and which receives photons 8 through said wall;

a second layer 2 or so-called absorption layer formed of P+ type semiconductor material for converting each photon 8 to an electron-hole pair;

a third layer 3 or so-called electron multiplication layer formed of N- type semiconductor material having a continuously-varying composition;

a fourth layer 4 or so-called transport layer formed of P+ type semiconductor material having the sole function of transmitting the electrons released by the photons 8 into the layer 3;

a metallic electrode 5 connected to the positive terminal of a generator for producing a voltage V, the negative terminal of said generator being connected to the first layer 1 in order to bias the four layers 1, 2, 3, 4 and thus to accelerate the electrons liberated by the light to be detected;

a last layer 6 for endowing the surface of the fourth layer 4 with the property of negative electron affinity in order that the electrons 7 transmitted by the layer 4 may be emitted into the vacuum.

Figure 1B:
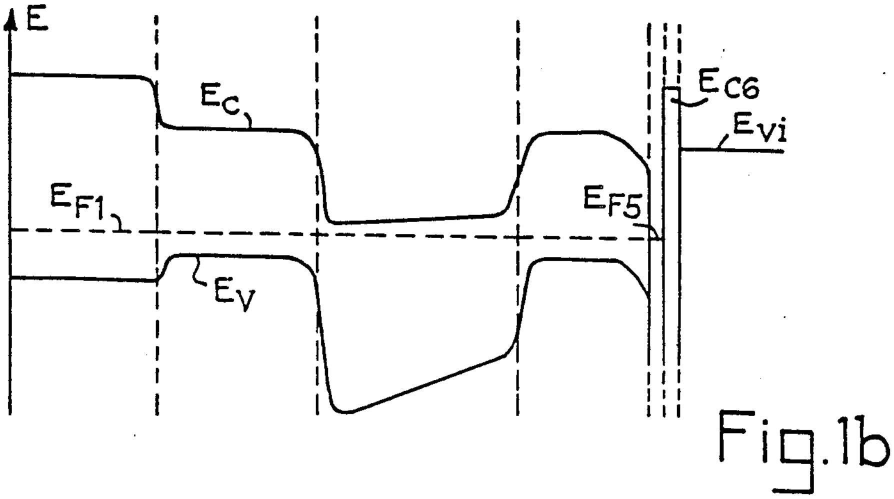

FIG. 1*b* represents a diagram of the energy levels E of the charge carriers within this example of construction when a bias is not applied. In this figure, the curve $E_c$ represents the minimum level of energy of the conduction band, the curve $E_v$ represents the maximum level of energy of the valence band, $E_{F1}$ represents the Fermi level of the layer 1, $E_{F5}$ represents the Fermi level of the metallic electrode 5, $E_{c6}$ represents the minimum level of energy of the conduction band of the last layer 6, and $E_{vi}$ represents the vacuum potential. The energy levels of the valence bands of the metallic electrode 5 and of the last layer 6 are not shown since they are very low.

It is apparent from this figure that the layer 1 has a large forbidden bandwidth corresponding to the transparency of said layer to the light to be detected. The layer 2 has a smaller forbidden bandwidth than the layer 1 and permits detection of all wavelengths of the light to be detected. The conduction band and the valence band of the layer 3 have energy levels which are respectively lower than those of the conduction band and valence band of the two preceding layers. The forbidden bandwidth of said layer 3 varies linearly and decreases from the layer 2 to the layer 4, that is to say in the direction in which the electrons are to be emitted. In this example, the layer 3 on the side nearest the layer 2 has a forbidden bandwidth equal to that of the layer 1 whereas this bandwidth on the side nearest the layer 4 is equal to that of the layer 4. Within the layer 3, the slope of the curve $E_c$ is approximately zero whereas the slope of the curve $E_v$ is positive in the direction of the layer 4.

The layer 4 has the same energy levels as the layer 2 both in its conduction band and in its valence band since, in this example, the layers 2 and 4 are formed of the same material and doped in the same manner. When no bias is applied, the Fermi level $E_{F1}$ of the layer 1 and the Fermi level $E_{F5}$ of the layer 5 are aligned and there are two potential steps within the conduction band and within the valence band, in the diagram region which corresponds to the layer 3.

Figure 1C:
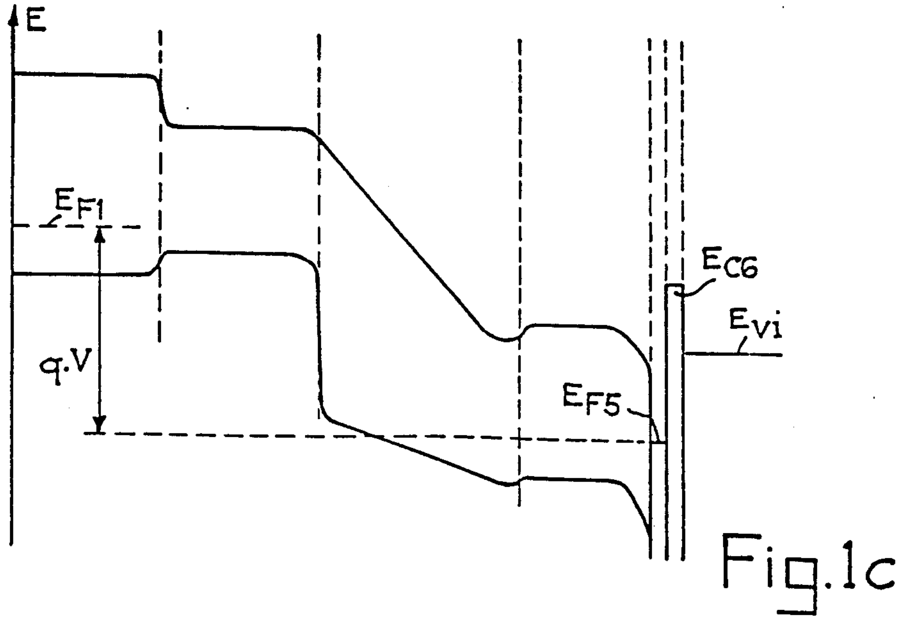

FIG. 1*c* is a diagram representing the energy levels of the carriers in the same example of construction but when a bias is applied. If V is the value of voltage applied between the metallic electrode 5 and the first layer 1, the Fermi level $E_{F5}$ of the electrode 5 is reduced by a value q.V with respect to the Fermi level $E_{F1}$ of the first layer, where q is the value of charge of an electron. The curves of energy levels of the conduction band and valence band of the layers 3, 4 and 5 are lowered. The curve of the level of minimum energy of the conduction band of layer 3 has a high negative slope in the direction of layer 4 corresponding to acceleration of electrons in the direction of layer 4. When this acceleration is sufficiently large, the electrons are multiplied by impact ionization. On the other hand, the curve of the maximum level of energy of the valence band of the layer 3 has a much lower negative slope since the gradual variation in composition of the material gives it a high positive slope in the absence of bias. This negative slope of much lower value imparts to the holes an acceleration in the direction of the layers 2 and 1 which is much smaller than the acceleration imparted to the electrons. The holes are therefore multiplied in a ratio which is much smaller than the electrons, thus avoiding any increase in photocathode noise.

The curves of the extrema of the energy levels of the conduction band and of the valence band of the layer 4 are joined to the curves of the extrema of the energy levels of the conduction band and of the valence band of the third layer 3 with a threshold which is practically zero, thus permitting easy passage of the electrons and holes between the layers 3 and 4. The electrons then pass through the layer 5 and the layer 6 and are ejected into the vacuum. The acceleration of these electrons is sufficient to cross by tunnel effect the potential well located at the level of the layer 5 and the potential step located at the level of the layer 6 since these layers 5 and 6 are extremely thin.

In this example of construction, the layer 1 consists of $Ga_{0.6}Al_{0.4}As$ doped with $5\times10^7$ atoms of zinc per $cm^3$ and having a thickness of the order of 1 micron. The layer 2 consists of GaAs doped with $10^{19}$ atoms of zinc per $cm^3$ and has a thickness of 2 microns. The layer 3 consists of $Ga_{1-x}Al_xAs$ in which x varies between 0.6 and 0 from the layer 3 to the layer 4. Said layer 3 is doped with $10^{15}$ atoms of zinc per $cm^3$ and has a thickness of 1 micron which is chosen so as to be slightly smaller than the carrier diffusion length. The layer 4 is formed of the same material as the layer 2 and has a thickness of 0.1 micron. The surface of said layer 4 is covered with a very thin film or mesh of silver so as to form the metallic electrode 5 and is then covered with a layer of Cs+O in order to endow it with negative electron affinity. An alternative form of construction may consist in dispensing with the metallic electrode 5 and applying a bias by connecting the positive terminal of the generator V to the layer 4.

The value of the bias voltage V is chosen so as to ensure that the slope of the curve $E_v$ of the minimum energy level of the conduction band of the layer 3 is negative in the direction of the layer 4 in order to accelerate the electrons. In one example of construction, this bias voltage is of the order of 15 volts.

Figure 2A:
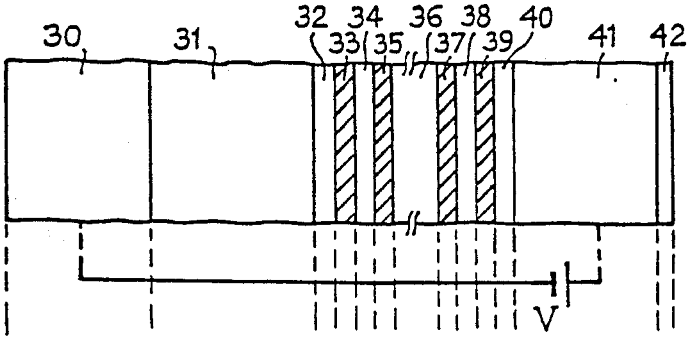

FIG. 2*a* is a sectional view showing a portion of a second example of construction of the photocathode in accordance with the invention. This second example comprises:

a first layer 30 which is similar to the first layer 1 of the first example of construction and is transparent to the light to be detected;

a second layer 31 or absorption layer which is similar to the layer 2 of the second example of construction;

ten electron multiplication layers consisting of twenty sublayers : 32, 33, 34, 35, . . . , 36, 37, 38, 39, 40;

a transport layer 41 which is similar to the layer 4 of the first example of construction but is connected to the positive terminal of the voltage generator V since there is no metallic electrode in this example of construction;

a last layer 42 for providing the layer 41 with negative electron affinity.

The ten electron multiplication layers are identical and each consist of two sublayers. For example, the multiplication layer 32–33 is composed of a first sublayer 32 and a second sublayer 33 formed of two $N^-$ type semiconductor materials having respectively two different compositions corresponding to two different bandwidths for the forbidden band, these two widths being larger than that of the material of the absorption layer 31.

Figure 2B:
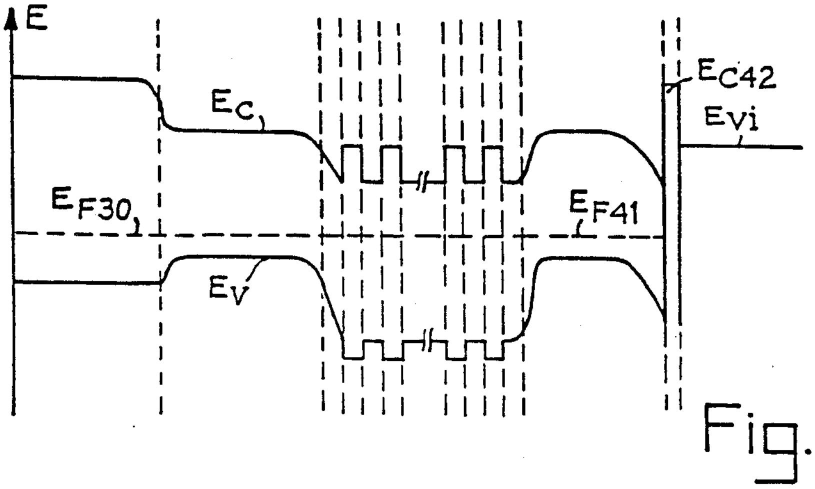

FIG. 2*b* is a diagram of the energy levels of the carriers at different points of the second example of construction when no bias is applied. It is apparent that the curves $E_c$ and $E_v$ of the extrema of the energy levels of the conduction band and of the valence band within the layers 32 to 40 are provided with potential steps corresponding to the sublayers 33, 35, . . . , 37, 39, the forbidden bandwidth of which is larger than that of the sublayers 32, 34, . . . , 36, 38, 40.

Figure 2C:
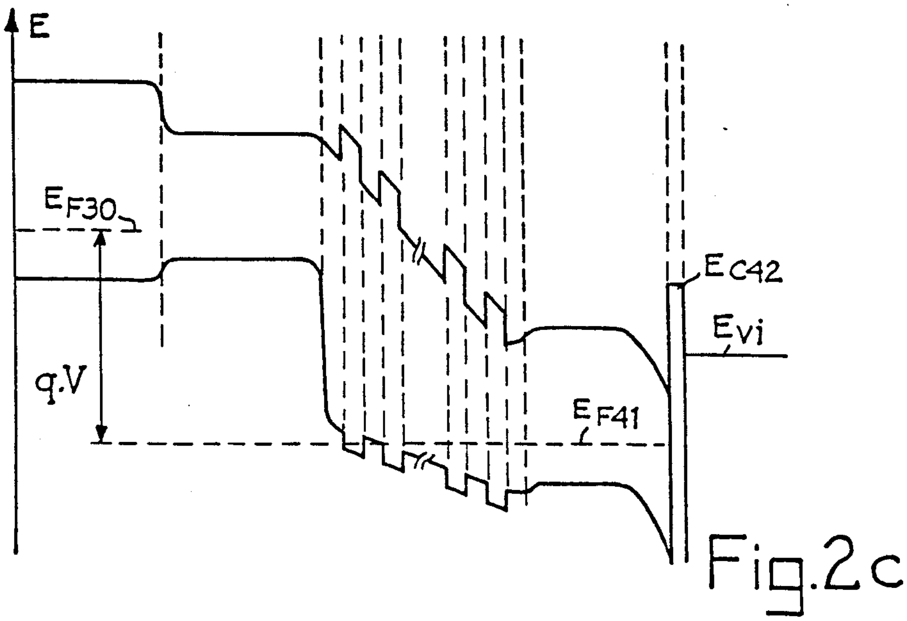

FIG. 2*c* is a diagram of the energy levels of the charge carriers at different points of this example of construction when a bias having a value V is applied to the layer 41 with respect to the layer 30. In the zone corresponding to the layers 32 to 40, the curves $E_c$ and $E_v$ of the extrema of the energy levels of the conduction band and of the valence band have a negative slope corresponding to an acceleration of electrons in the direction of the layer 41 or in other words in the direction in which the electrons are to be emitted, and an acceleration of the holes in the direction of the layer 31. This acceleration is sufficient to ensure that the electrons cross by tunnel effect the potential steps located at the boundary between the sublayers 32 and 33, 34 and 35, . . . , 38 and 39. Each time an electron crosses one of the downward potential steps located at the boundary of the sublayers 33 and 34, 35 and 36, . . . , 39 and 40, said electron is subjected to abrupt acceleration in the downward direction and is thus permitted to liberate an additional electron by impact ionization, and these two electrons then pass across the following step and create two other additional electrons.

The holes undergo a multiplication which is much less efficient since the tunnel effect is weaker by reason of the fact that they have a greater effective mass than the electrons. On the other hand, the materials constituting the sublayers 32, 33, . . . , 39, 40 are chosen so as to ensure that the potential steps in the valence band are of smaller height than in the conduction band in order to impart to the holes an acceleration of lesser magnitude than the acceleration imparted to the electrons.

In theory, the number of electrons can be multiplied twice at a maximum each time crossing of a potential step occurs if the bias is sufficiently strong. The multiplication factor can theoretically attain $10^3$ in the case of ten multiplication layers each having two sublayers. In one example of construction, the bias potential V is of the order of 20 volts, each sublayer 32, 34, . . . , 36, 38, 40 is formed of $Ga_{0.9}Al_{0.1}As$ having a forbidden bandwidth of 1.56 eV and a thickness of 0.05 micron and each sublayer 33, 35, . . . , 37, 39 is formed of $Ga_{0.7}Al_{0.3}As$ having a forbidden bandwidth of 1.8 eV and a thickness of 0.05 micron.

The value chosen for the thickness of an assembly of two successive sublayers is of the same order of magnitude as the mean free path of impact ionization of the electrons.

The ideal composition of materials constituting these two types of sublayers would be such that the difference in level of their conduction bands is greater than the ionization energy of one of these two materials, namely the material which has the smaller forbidden bandwidth.

In the absence of an ideal composition, the composition chosen should be such that the potential discontinuity within the conduction band is greater than in the valence band in order to ensure that impact ionization of the electrons is more efficient than that of the holes. In the case of the hot electrons produced by tunnel effect, the energy which is lacking in order to carry out impact ionization is supplied to the electrons by the polarization field. The choice of the composition of materials and the choice of polarization are within the capacity of those versed in the art.

Figure 3A:
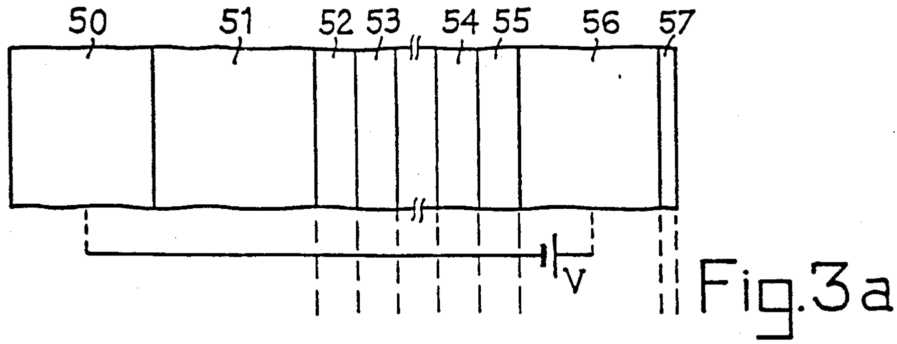

FIG. 3*a* represents a third example of construction of the photocathode in accordance with the invention. This third example comprises:

two first layers 50 and 51 which are similar to the layers 30 and 31 of the second example of construction;

two last layers 56 and 57 which are similar to the two last layers 41 and 42 of the second example of construction, the layer 56 being biased by a voltage generator V with respect to the first layer 50;

ten electron multiplication layers 52, 53, . . . , 54, 55, each of these layers being formed of N type semiconductor material having a composition which varies gradually in order to provide a forbidden band of increasing width in the direction of the layer 56 or in other words in the direction in which the electrons are to be emitted.

Figure 3B:
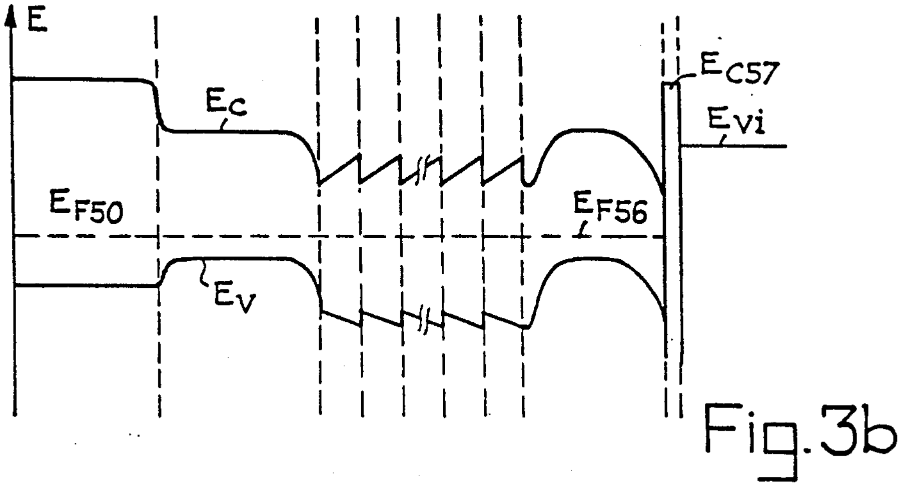

FIG. 3*b* is a diagram of the energy levels of the carriers in this third example of construction when no bias is applied. In the region corresponding to the electron multiplication layers 52 to 55, the curves $E_c$ and $E_v$ of the energy level extrema have a sawtooth shape consisting of a slope and a steep edge. Each sawtooth has a positive slope for the conduction band and a negative slope for the valence band in the direction of movement of the electrons.

In this example of construction, the thickness of each electron multiplication layer 52 to 55 is 0.03 micron and its composition is $Ga_{1-x}Al_xAs$ with x which varies linearly from 0 to 0.3 to 0 from the layer 51 to the layer 56, that is to say in the direction of discharge of the electrons.

Figure 3C:
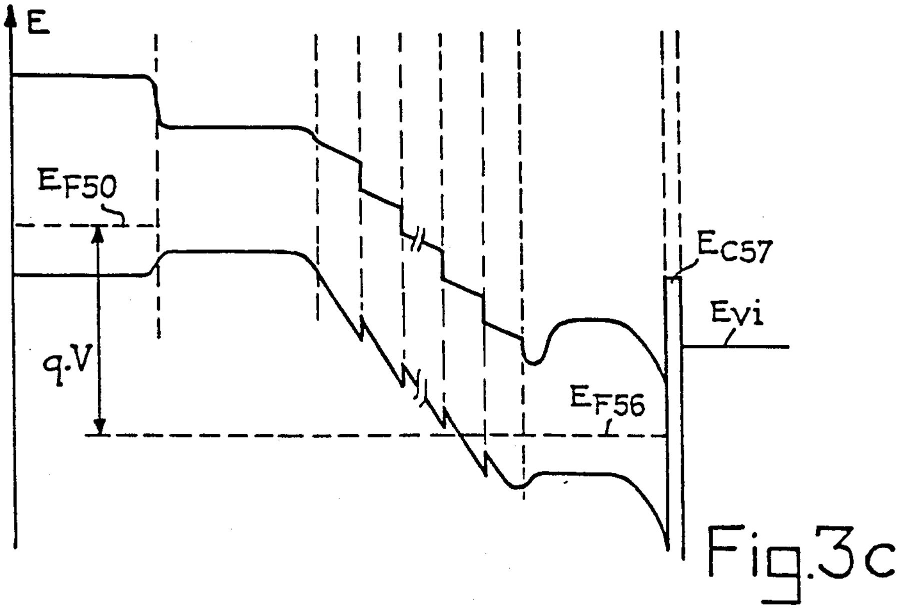

FIG. 3*c* is a diagram representing the carrier energy levels in this third example of construction when the bias voltage V is applied. The reduction q.V in Fermi energy $E_{F56}$ of the layer 56 with respect to the Fermi level $E_{F50}$ of the layer 50 modifies the slope of the saw-teeth and this slope becomes negative in the case of the conduction band. Within the conduction band, the electrons move downwards along the sawtooth slopes without colliding with the vertical edges whereas, in the valence band, the holes come into contact with the sawtooth edges which constitute potential steps. Each time an electron jumps from one sawtooth to tee next, it undergoes abrupt acceleration which enables it to liberate another electron by ionization.

The ideal composition of the materials would be such that the height of the potential steps would be greater than the ionization energy of the material having the smallest forbidden bandwidth, that is to say $Ga_{0.7}Al_{0.3}As$ in this example. In the absence of an ideal composition, the composition chosen should be such that the potential discontinuity within the conduction band has the highest possible value. The energy lacked by one electron which crosses a potential discontinuity in order to carry out impact ionization is supplied by the polarization field. The choice of materials and the choice of polarization which satisfies these conditions are within the capacity of those versed in the art. In the case of twenty multiplication layers thus formed, the multiplication factor is theoretically of the order of $10^6$.

In this alternative form of construction, other materials may be considered. By way of example, InAlAs may be employed for the layer 50, InP or InGaAs may be employed for the layer 51, $In_xGa_{1-x}As_{1-y}P_y$ may be employed for the layers 52 to 55 where x and y preferably vary in accordance with the prior art in such a manner as to ensure that the material of layers 52 to 55 is lattice-matched with the material of the absorption layer 51, and InP may be employed for the layer 56. In this example, the difference in forbidden bandwidth is 0.8 eV and the bias voltage is approximately 20 V in the case of twenty multiplication layers 52, 53, . . . having a thickness of the order of 0.03 micron.

The bias voltage V to be applied between the layers 56 and 50 of this alternative embodiment is of the order of: $V=n.E_g$, where n is the number of multiplication layers 52, 53, . . . , 55 and where $E_g$ is the forbidden bandwidth which is necessary for the purpose of liberating an electron by impact within one of these multiplication layers.

Other materials may be contemplated for this alternative form of construction. Thus, GaAlAs may be employed for the layer 50, GaAs may be employed for the layer 51, $Ga_{1-x}Al_xAs$ where x varies from 0 to 1 may be employed for the layers 52, . . . , 55, and GaAs may be employed for the layer 56.

Figure 4A:
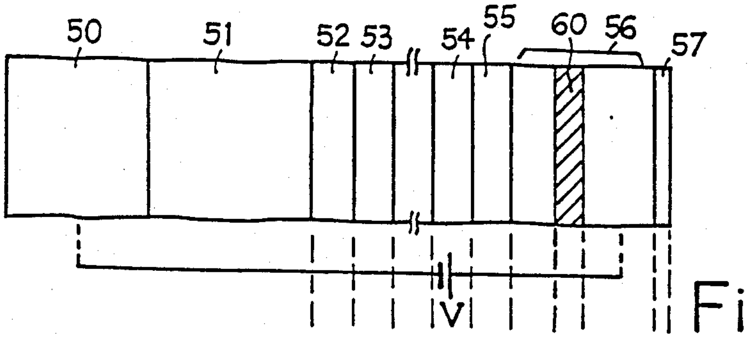
Figure 4B:
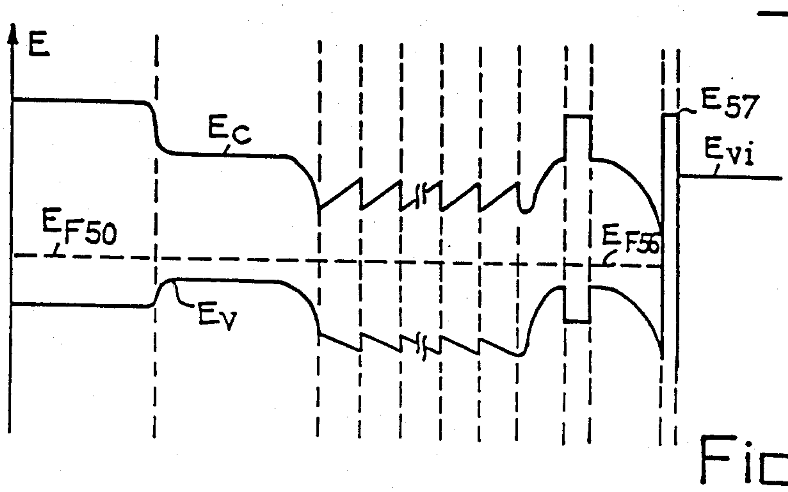
Figure 4C:
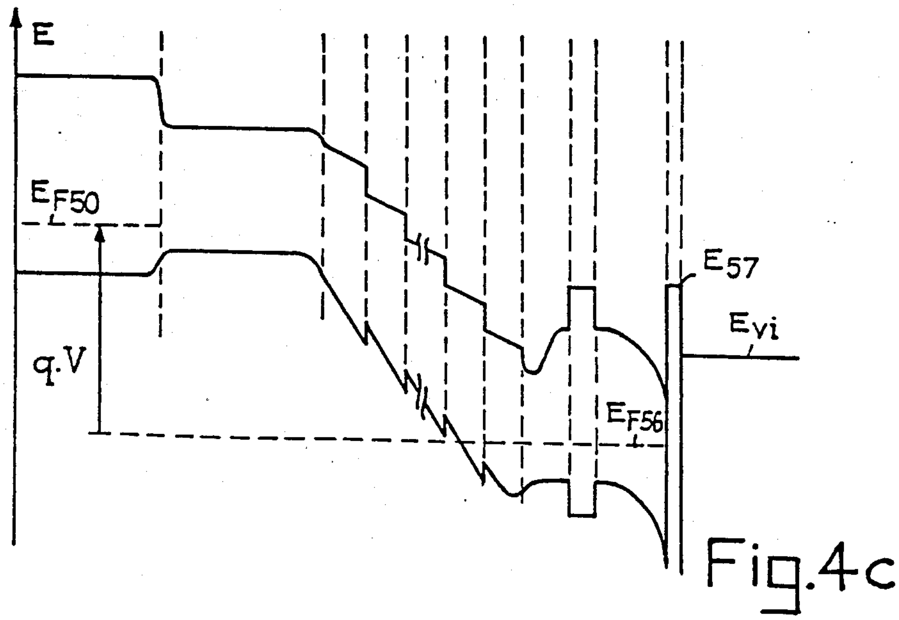

FIG. 4*a* shows a cross-section of a portion of a fourth example of construction of the photocathode in accordance with the invention. This fourth example differs from the third example solely in respect of an additional layer 60 which is inserted in the layer 56. The additional layer 60 is formed of P+ type semiconductor material having a forbidden bandwidth which is larger than that of the material of the layers 56 and 51 in order to create a potential barrier within the valence band and thus to stop the flow of the majority of holes. This barrier serves to reduce the hole current which is the cause of unnecessary electric power consumption and of a dark current since it generates electron-hole pairs by ionization.

The thickness of said layer 60 must be of sufficient value to stop the flow of holes while at the same time being sufficiently small to ensure that said layer 60 is practically transparent to the electrons which cross this latter by tunnel effect. This difference in transparency is obtained by virtue of the large difference in effective mass between the electrons and the holes. This additional layer can be constituted for example by $Ga_{0.6}Al_{0.4}As$ having a thickness of 0.003 micron and doped with 1019 atoms of zinc per $cm^3$.

A layer 60 of this type can also be provided in the layers 4 and 41 of the first and second examples of construction of the photocathode in accordance with the invention.

The invention is not limited to the examples of construction described in the foregoing. Many alternative forms are within the capacity of any one conversant with the art, particularly in regard to the number of electron multiplication layers and constituent materials.

The invention is also applicable in particular to pickup tubes for television cameras and to image intensifier tubes for taking pictures at low light levels.

What is claimed is:

1. A photocathode having internal amplification, comprising:

first electrode means located to receive photons and adapted for receiving a first voltage, for transmitting therethrough said received photons;

absorption layer means, adjacent said first electrode means and comprising a P-type semiconductor material having a forbidden bank of sufficiently small width to cause photons received through said first electrode means to be converted into electron-hole pairs;

at least one ionization-inducted electron multiplication layer means, adjacent said absorption layer means, and comprising two sub-layers of an N-type semiconductor material having respectively two different compositions at an interface therebetween, for causing, when said multiplication layer means is biased, the electrons received from said absorption layer means to be accelerated and for causing the holes received from said absorption layer means to be accelerated less than said electrons;

a transport layer, adjacent said ionization induced electron multiplication layer means, and formed of the same material as said absorption layer;

second electrode means, adjacent said transport layer, for receiving a second voltage to cause said photocathode to be biased, for transmitting therethrough accelerated electrons received from said multiplication layer means through said transport layer; and emission layer means adjacent said second electrode means and comprising a material which produces negative electron affinity for causing accelerated electrons received from said second electrode means to be emitted into a vacuum.

2. A photocathode according to claim 1, wherein said multiplication layer means comprises a first sublayer having a thickness of 0.05 micron and comprising $Ga_{0.9}Al_{0.1}As$, and a second sublayer having a thickness of 0.05 micron and comprising $Ga_{0.7}Al_{0.3}As$.

3. A photocathode according to claim 1 wherein each sublayer of said ionization-induced electron multiplication layer comprises an N-type semiconductor material having a composition which varies continuously so as to ensure that its forbidden bandwidth increases in a direction in which the electrons are transmitted.

4. A photocathode according to claim 3, wherein each said sublayer comprises $Ga_{1-x}Al_xAs$ where x varies linearly from 0.3 to 0 in the direction in which the electrons are transmitted and has a thickness of 0.03 micron.

5. A photocathode according to claim 3, wherein each said sublayer comprises $In_xGa_{1-x}As_{1-y}P_y$ where x and y vary in such a manner as to ensure that the N-type semiconductor material of said each sublayer is lattice-matched with the P-type semiconductor material of said absorption layer means, and said each sublayer has a thickness of 0.03 micron.

6. A photocathode according to claim 1, further comprising layer barrier means, disposed within said second electrode means, for reducing hole current and comprising a P-type semiconductor material having a forbidden band which is greater than the forbidden band of the absorption layer means, a thickness of said barrier layer means being sufficiently small to permit the passage of electrons by tunnel effect with high probability while being sufficiently large to stop the greater part of the hole current.

7. A photocathode according to claim 6, wherein said barrier layer means comprises a layer of $Ga_{0.6}Al_{0.4}As$ having a thickness smaller than 0.0045 micron.

8. A photocathode according to claim 1 wherein said sublayers comprise N-type semiconductor material having respectively two different homogenous compositions.

9. A photocathode according to claim 8 wherein a first one of said sublayer comprises $Ga_{0.9}Al_{0}As$ having a thickness of 0.05 micron, and wherein a second one of said sublayers comprises $Ga_{0.7}Al_{0.3}As$ having a thickness of 0.05 micron.

10. A photocathode as in claim 1 further comprising a negative electron affinity layer, covering said transport layer.

* * * * *